United States Patent
Pathak et al.

(10) Patent No.: US 11,928,582 B1
(45) Date of Patent: Mar. 12, 2024

(54) SYSTEM, MEDIA, AND METHOD FOR DEEP LEARNING

(71) Applicant: Cadence Design Systems, Inc., San Jose, CA (US)

(72) Inventors: Piyush Pathak, Fremont, CA (US); Haoyu Yang, Ma Liu Shui (HK); Frank E. Gennari, Campbell, CA (US); Ya-Chieh Lai, Mountain View, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 813 days.

(21) Appl. No.: 16/237,524

(22) Filed: Dec. 31, 2018

(51) Int. Cl.
  *G06N 3/08* (2023.01)
  *G06F 30/392* (2020.01)
  *G06N 3/042* (2023.01)

(52) U.S. Cl.
  CPC ............ *G06N 3/08* (2013.01); *G06F 30/392* (2020.01); *G06N 3/042* (2023.01)

(58) Field of Classification Search
  CPC ............................. G06N 3/08; G06N 3/0427
  See application file for complete search history.

(56) References Cited

U.S. PATENT DOCUMENTS

| | | | | |
|---|---|---|---|---|
| 5,440,651 | A * | 8/1995 | Martin | G06V 10/24 382/173 |
| 6,456,137 | B1 * | 9/2002 | Asao | H03H 11/265 327/272 |
| 11,410,076 | B1 * | 8/2022 | Huszar | G06F 17/11 |
| 11,537,134 | B1 * | 12/2022 | Wiest | G06N 3/0455 |
| 2006/0064415 | A1 * | 3/2006 | Guyon | G16B 40/20 |
| 2015/0213374 | A1 * | 7/2015 | Agarwal | G06K 9/6269 706/12 |
| 2017/0287109 | A1 * | 10/2017 | Tasfi | G06K 9/6215 |
| 2018/0121796 | A1 * | 5/2018 | Deisher | G06N 3/0472 |
| 2018/0150695 | A1 * | 5/2018 | Guttmann | G06K 9/00718 |
| 2018/0260683 | A1 * | 9/2018 | Gulland | G06N 3/04 |

(Continued)

FOREIGN PATENT DOCUMENTS

| WO | WO-9952059 A2 * | 10/1999 | ......... G06K 9/00288 |
|---|---|---|---|
| WO | WO-2012123619 A1 * | 9/2012 | ........... G06F 1/3206 |

OTHER PUBLICATIONS

Le Cun et al. (Convolutional Networks for Images, Speech, and Time-Series, 1995, pp. 1-14) (Year: 1995).*

(Continued)

*Primary Examiner* — George Giroux
(74) *Attorney, Agent, or Firm* — Vista IP Law Group, LLP

(57) ABSTRACT

Embodiments of the invention provide a system, media, and method for deep learning applications in physical design verification. Generally, the approach includes maintaining a pattern library for use in training machine learning model(s). The pattern library being generated adaptively and supplemented with new patterns after review of new patterns. In some embodiments, multiple types of information may be included in the pattern library, including validation data, and parameter and anchoring data used to generate the patterns. In some embodiments, the machine learning processes are combined with traditional design rule analysis. The patterns being generated and adapted using a lossless process that encodes the information of a corresponding area of a circuit layout.

20 Claims, 13 Drawing Sheets

(56) References Cited

U.S. PATENT DOCUMENTS

2018/0321938 A1* 11/2018 Boswell ............... G06F 9/3012
2018/0336164 A1* 11/2018 Phelps ................. G06F 7/5443
2018/0357537 A1* 12/2018 Munkberg ............ G06N 3/063
2020/0076570 A1*  3/2020 Musuvathi ............. G06F 21/72

OTHER PUBLICATIONS

Bromley et al. (Signature Verification using a "Siamese" Time Delay Neural Network, 1994, pp. 737-744) (Year: 1994).*

* cited by examiner

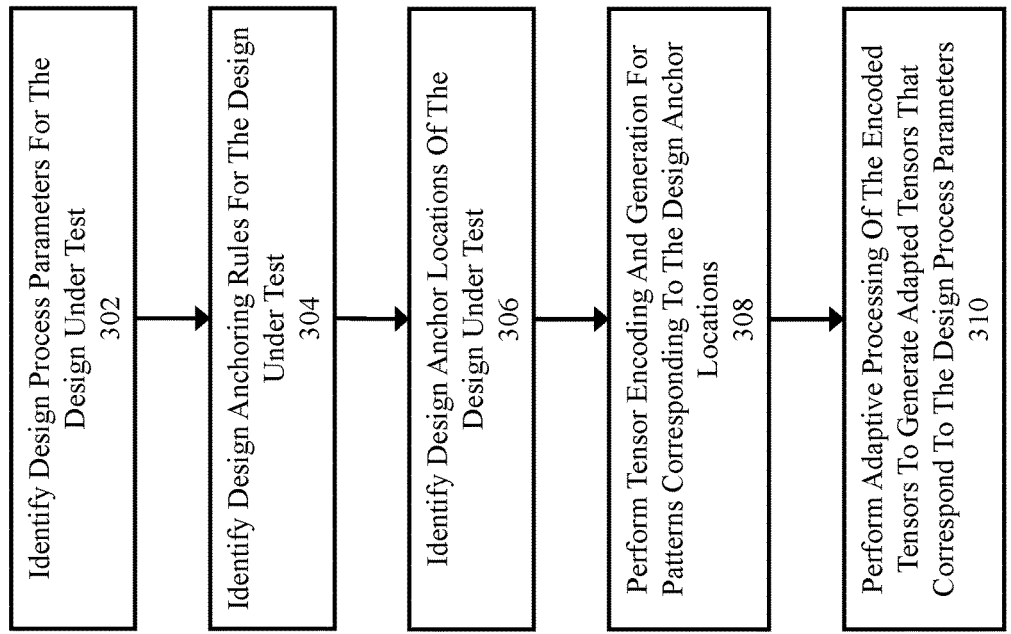

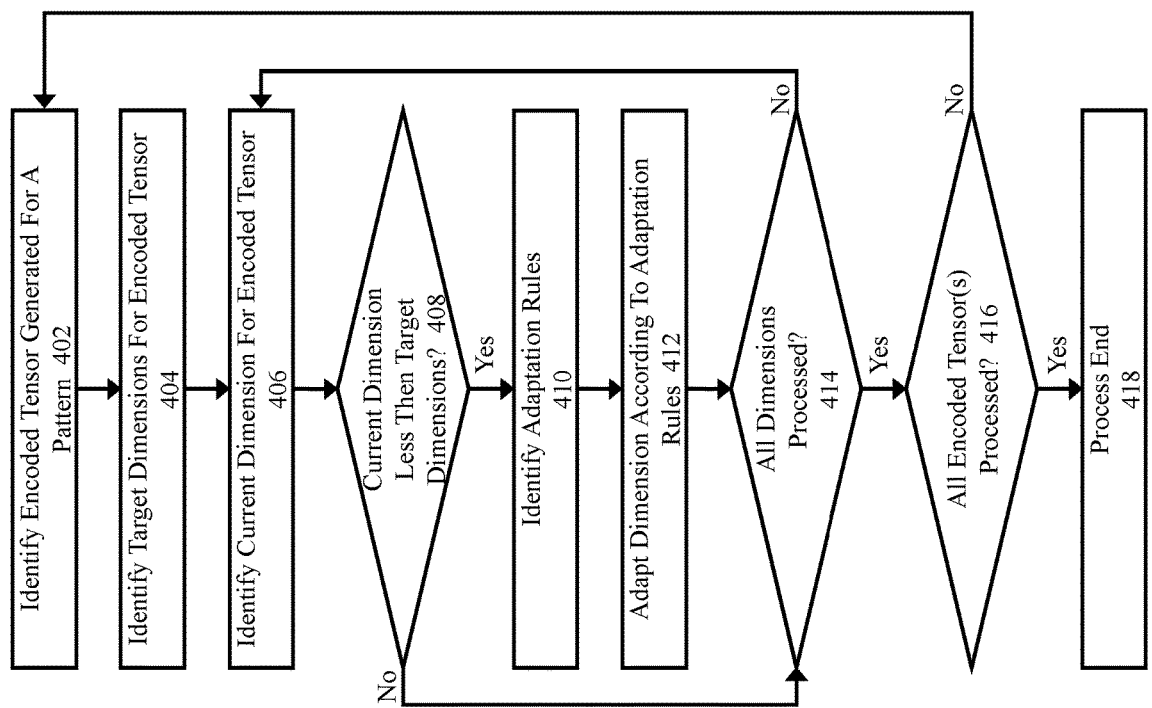

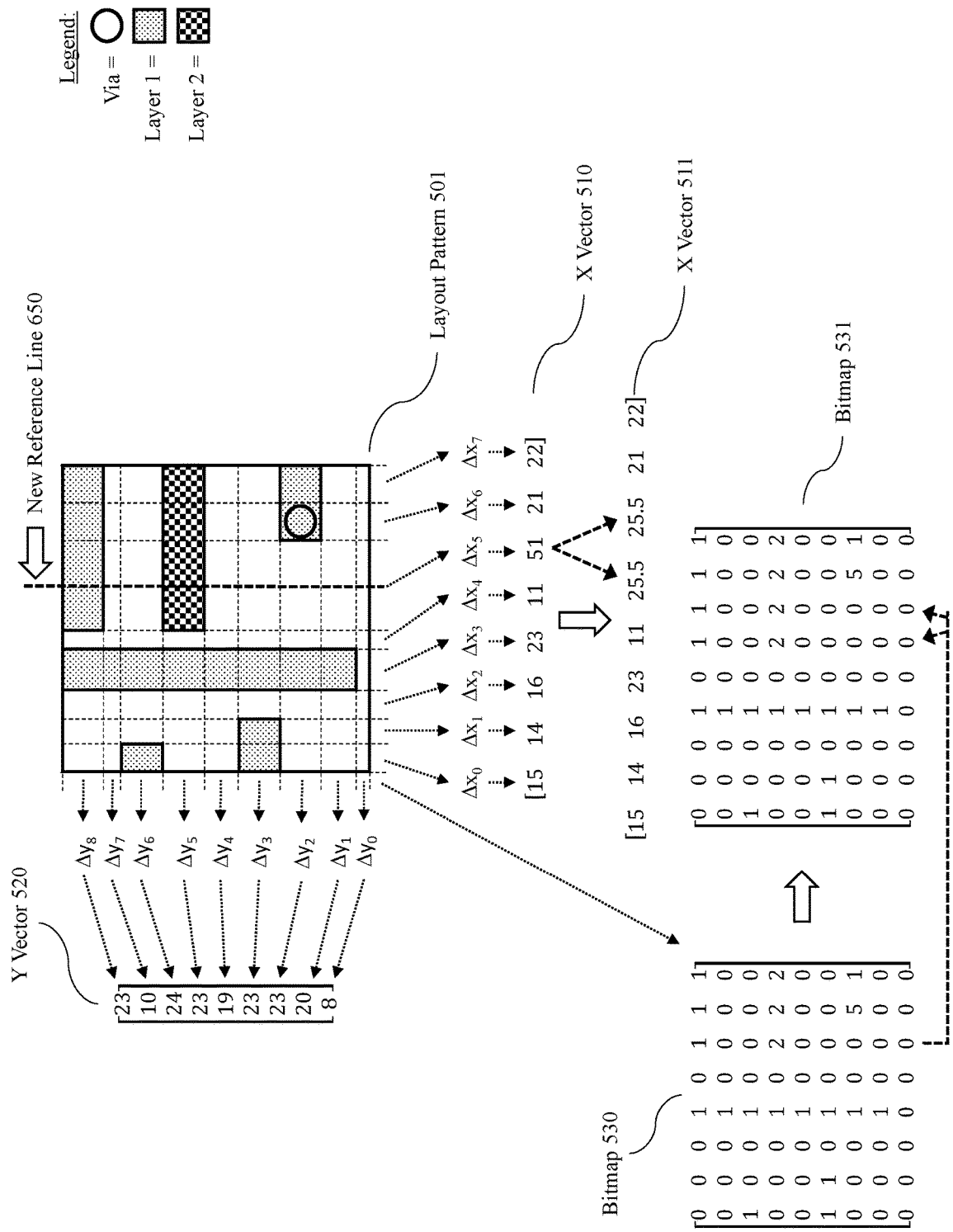

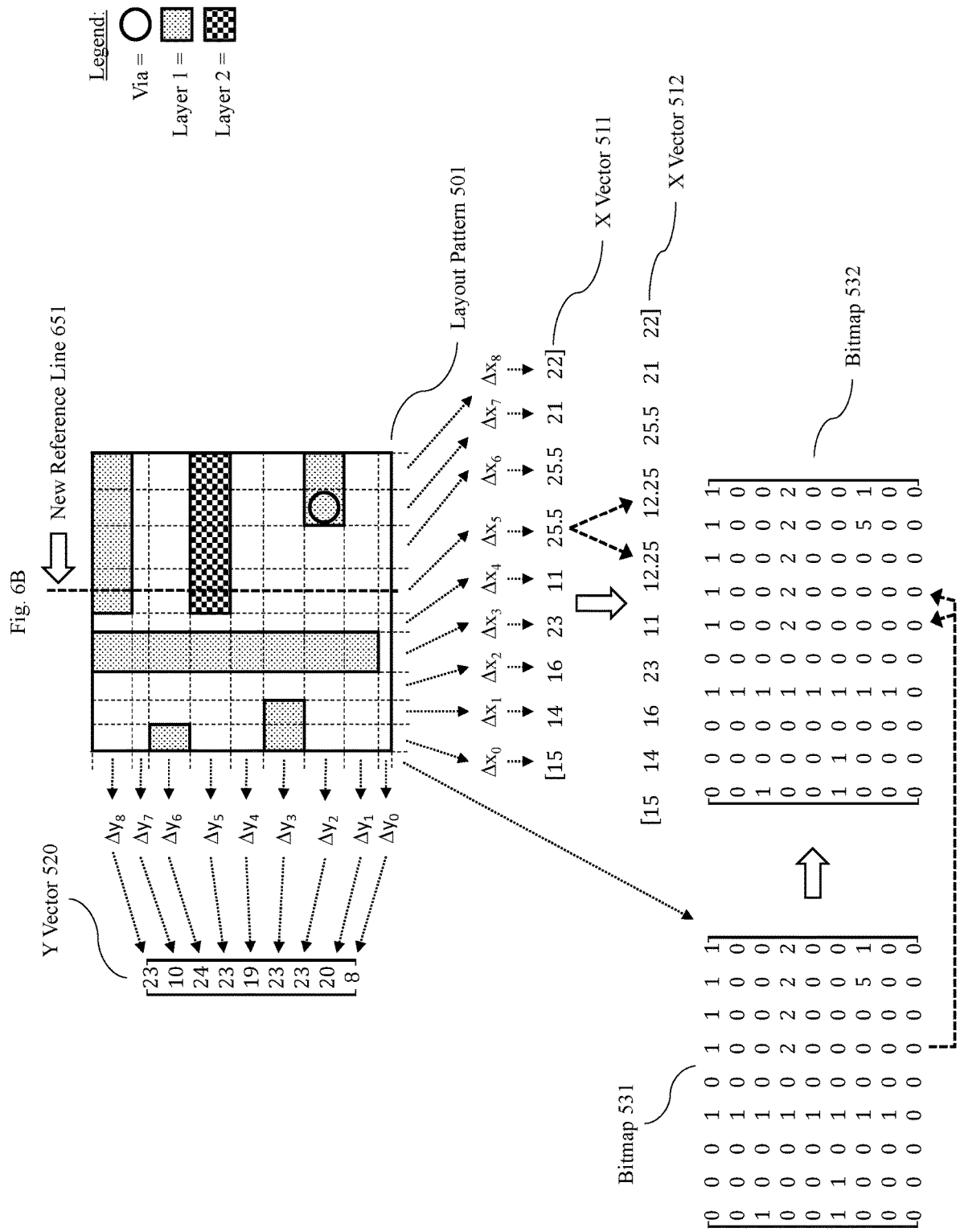

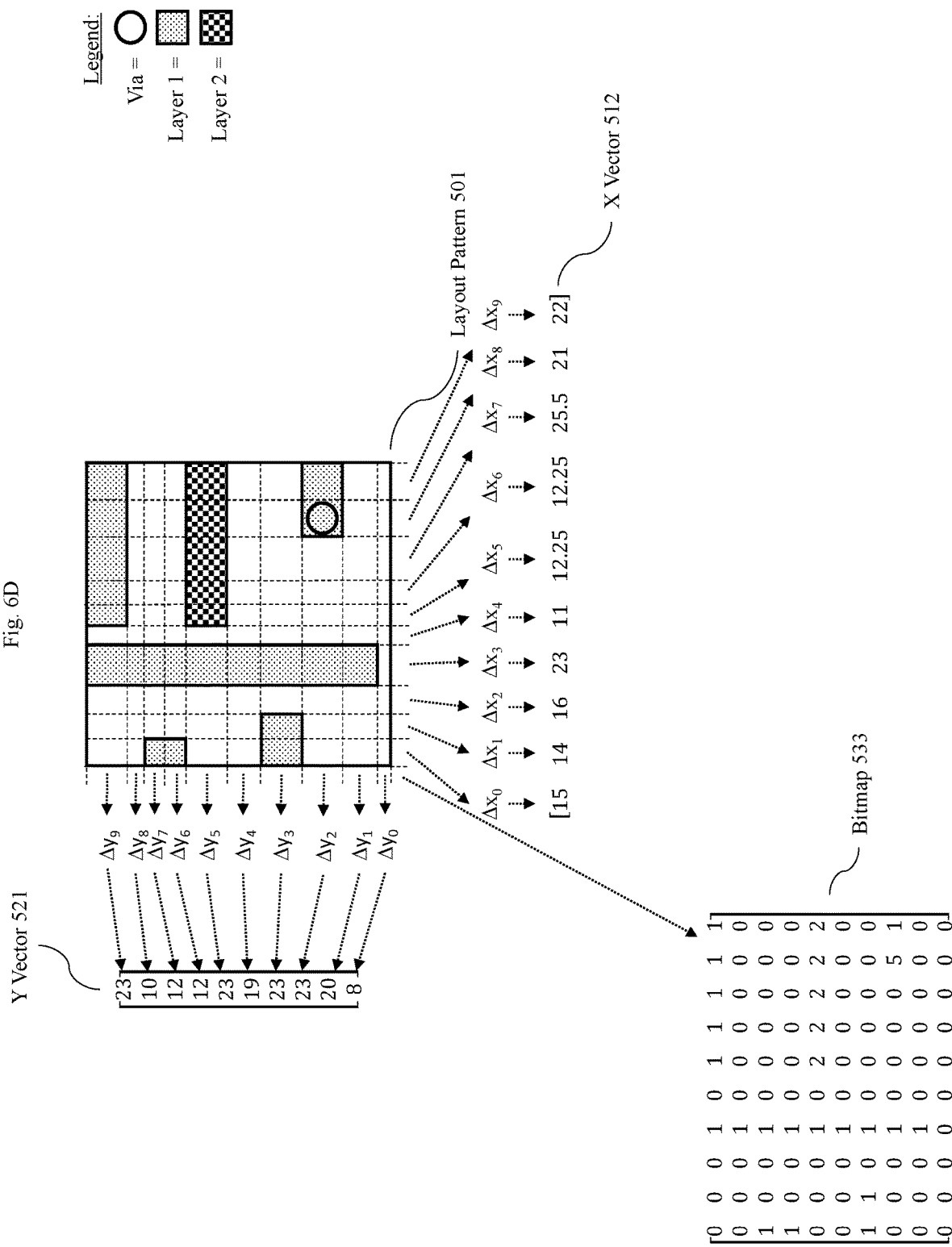

SYSTEM, MEDIA, AND METHOD FOR DEEP LEARNING

FIELD

This disclosure relates to the field of deep learning applications in physical design verification.

BACKGROUND

Integrated circuit production relies heavily on analysis and preproduction quality control processes, with most chips going through multiple phases of analysis and verification prior to the sale of any actual products. For example, semiconductors often undergo multiple design phases, a first phase where a circuit schematic is created/designed, a second phase where the circuit schematic is translated to a chip layout, and a third phase where masks are fabricated and used for production of wafers—where each phase includes analysis and verification processes. However, the physical production process, including creation of the masks, is incredibly expensive. Thus, any processes that can effectively and efficiently identify issues prior to production could potentially save large sums of money and time.

Traditionally, layout analysis and verification have been restricted to two processes, manual review by a layout engineer and an issue identification processes that relies on manually programmed rules to identify occurrences of known issues. However, the traditional approach suffers from significant shortcomings. For instance, manual review of a chip design is generally not humanly possible in a reasonable timeframe with chips having extremely large numbers of transistors. Additionally, the identification and codification of manually identified issues can be very time consuming. Furthermore, these rules can only account for known issues and thus will not identify similar but not otherwise conforming issues.

Machine learning (e.g. deep learning applications) presents one possible way to identify layout issues. However, current formats used to represent circuit layouts are either entirely unusable for machine learning or cannot be effectively used—e.g. because circuit layouts are not maintained in a format that machine learning modules are capable of processing and because the sheer number of features present too complex a problem to solve in a single pass. One possible way to address this issue is to generate smaller representations of portions of the circuit layout. Unfortunately, without more, these techniques will generate representations of differing sizes which cannot be efficiently or reliably analyzed with machine learning processes. In order to address the issue of differing sizes, one technique is to use padding to normalize the size of the representations. However, inserting padding creates additional data that must be stored and processed. Furthermore, the padding can obscure the details in a representation because machine learning processes do not know the difference between the padding and the original representation. As a result, padding may have an oversized effect on the results of training and analysis of/with a machine learning model. In circuit layout applications, where the number of features within a particular area can vary widely, simply adding padding to patterns can result in the design features being heavily obscured. As a result, the usability of results may be minimal at best.

Thus, what is needed is an efficient process for implementing deep learning applications in physical design verification.

SUMMARY

Embodiments of the invention provide a system, media, and method for deep learning applications in physical design verification. Generally, the approach includes maintaining a pattern library for use in training machine learning model(s). The patterns correspond to small portions of a larger design that contain a feature of interest. Features of interest can be identified using one more anchoring rules, where the anchoring rules are used to identify locations within a design having a matching characteristic. The pattern library can be generated adaptively and supplemented with new patterns after review of those new patterns. In some embodiments, multiple types of information may be included in the pattern library, including validation data, and parameter and anchoring data used to generate the patterns. In some embodiments, the machine learning processes are combined with traditional design rule analysis. The patterns can be generated and adapted using a lossless process to encode the information of a corresponding area of a circuit layout.

BRIEF DESCRIPTION OF THE DRAWINGS

In order that the present invention is better understood, some embodiments of the invention will now be described, by way of example only, with reference to the accompanying drawings.

FIG. 3 illustrates an expanded view of the process of adaptively generating tensors from a design under test based on design parameters shown in FIG. 2 according to some embodiments of the invention.

FIG. 4 illustrates an expanded view of the process to perform adaptive processing of the encoded tensors to generate adapted tensors that correspond to the design process parameters shown in FIG. 3 according to some embodiments of the invention.

FIG. 6A-6D illustrates an example process of adaptive tensor encoding and generation for an example pattern according to some embodiments of the invention.

DETAILED DESCRIPTION

Figure 1:
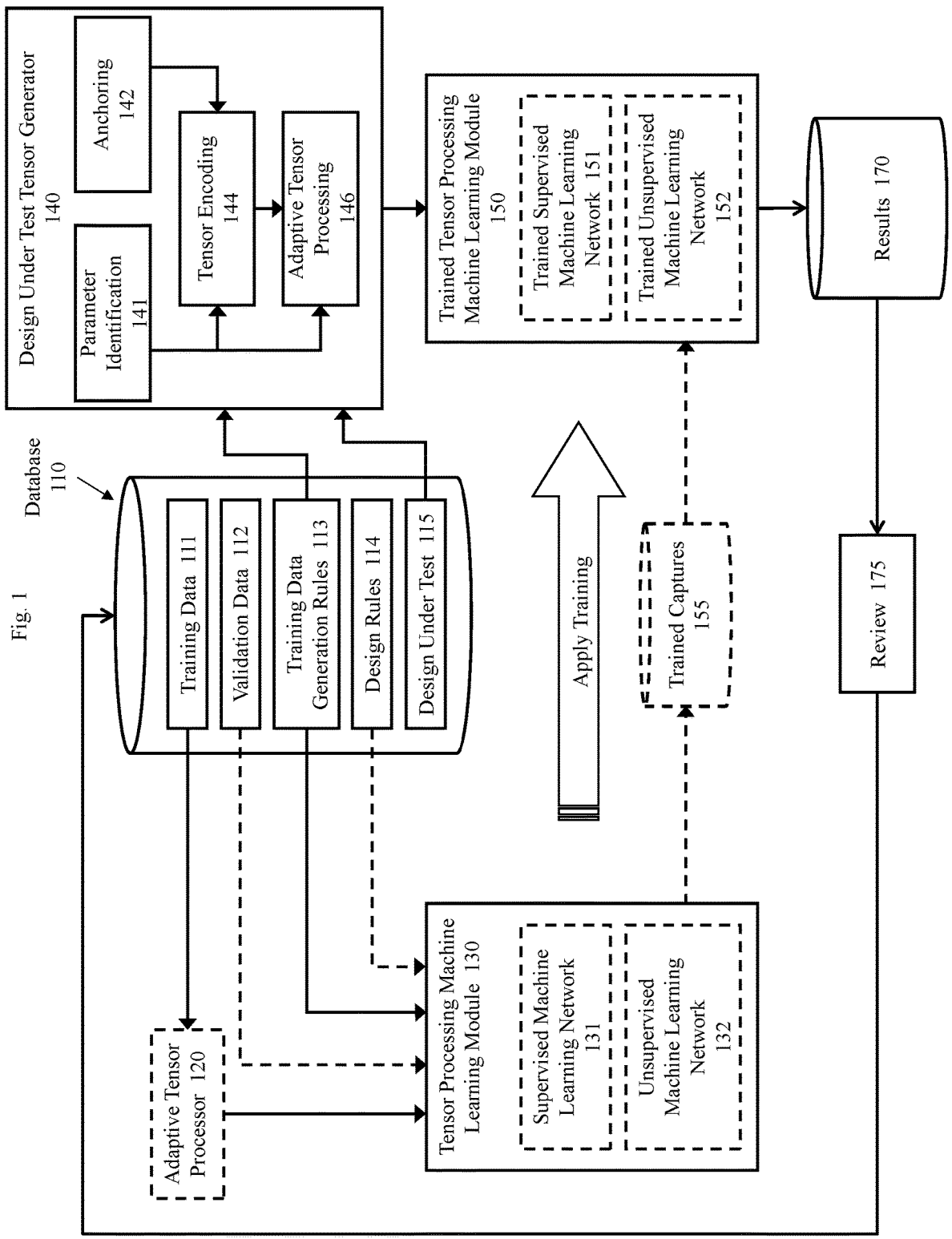
FIG. 1 illustrates an example apparatus in which some embodiments of the invention are implemented.

Various embodiments will now be described in detail with reference to the drawings, which are provided as illustrative examples of the invention to enable those skilled in the art to practice the invention. Notably, the figures and the examples are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

As will be discussed further below, the present disclosure provides a system, media, and method for deep learning applications in physical design verification. In particular, the present disclosure provides an improved way of representing portions of a circuit layout for processing with machine learning models. In particular, a lossless way to represent a portion of a circuit layout is provided in one aspect of the disclosure, where that lossless manner of representing a portion of a circuit layout allows for maintaining the maximum fidelity of the design. In another aspect, the present disclosure provides a lossless way to size generated representations—to conform to target dimensions—without using padding while allowing for rotation and/or mirroring both representations. This enables the use of machine learning to analyze portions of a circuit layout that do not suffer from the effects of padding and that do not require the maintenance and processing of data representing that padding. A representation is lossless if the representation could be used to recreate the portion of the circuit layout it represents without loss of detail or error.

Specifically, the present disclosure provides an approach for leveraging machine learning processes such as those used for image recognition in a physical design verification process for electronic design automation. In some embodiments, this includes encoding and maintaining integrated circuit layout information as patterns for use in image-based machine learning. These patterns can be generated in a first aspect that creates a representation of portions of a circuit layout in the form of a tensors. Subsequently, the generated tensors can be sized to be consistent with a desired set of dimensions, such as a set of dimensions corresponding to a library of training patterns. Additionally, both the initial representation and the sizing is completed in a lossless manner where the very portion of the circuit layout could be recreated from the tensor, but while also being in form that is readily analyzable using machine learning processes developed for image processing. Because these patterns are lossless representations of portions of circuit layouts generated without added padding they do not suffer from the same drawbacks as images generated using padding techniques—e.g. they do not consume extra space for padding, do not require that a processing device analyze padding within the representation, and do not obscure the original pattern because it is losslessly represented. This is in direct contrast to prior techniques where multiple bitmaps representing the different colors and their intensities of an image (e.g. red, green, blue or conversions thereof) are surrounded by padding in order to normalize the size of the image for processing using machine learning.

FIG. 1 illustrates an example apparatus in which some embodiments of the invention are implemented. The apparatus includes a tensor processing machine learning module, which may be connected to one or more datasets to train and execute adaptively processed tensors.

The apparatus, as illustrated, includes multiple components/modules that work together to enable the use of tensor processing machine learning modules to train for and execute analysis on adaptively processed tensors. The illustration includes a database 110, optionally an adaptive tensor processor 120, a tensor processing machine learning module 130, a design under test tensor generator 140, a trained tensor processing machine learning module 150, optionally a trained captures database 155, a results output 170, and review element 175.

The database 110 includes multiple subsets such as the training data 111, validation data 112, training data generation rules 113, design rules 114, and the design under test 115. In some embodiments, all the illustrated data (including trained captures 155 and results 170) may be included in a single database (e.g. database 110). However, the illustrated data may also be separated into multiple different databases that are remotely accessible. For instance, some embodiments include the training data 111, validation data 112, training data generation rules 113, and design rules 114 on a first database, where the design under test 115 and results 170 are on a second database, and the trained network captures are on a third database.

The training data 111, comprises one or more sets of patterns previously processed using the design under test tensor generator 140 and a trained processing machine learning module 150. The patterns represent small portions from a previously analyzed design. In some embodiments, the patterns are analyzed by a human in order to generate training data. However, the patterns may instead (or in addition) be analyzed using the trained tensor processing machine learning module 150, as well as manual review, or some combination thereof to generate training data 111. Furthermore, some embodiments include the number of occurrences of each particular pattern found within the design under test, can be sorted based on number of occurrences during a review process (see 175).

In some embodiments, the patterns stored in the training data 111 are associated with one or more orientations. For instance, a single pattern could be associated with one or more of a orientations (e.g. rotations of 0, 90, 180, 270 degrees) where each orientation corresponding to rotations of the pattern also corresponds to a pattern that were found in a design or training library—e.g. a single instance of a pattern could be maintained for both a rotation of zero (a first occurrence orientation) and a flipped version of the pattern (a 180 degree rotation). Furthermore, in some embodiments, each orientation could be associated with different validation and anchoring rules. In some embodiments, a single pattern can also be associated with a mirroring of that pattern, where a first occurrence corresponds to the stored pattern, and a second occurrence corresponds to a mirrored version of that pattern. In some embodiments, the first occurrence and the second occurrence correspond to different validation and anchoring rules. In some embodiments, the training data 111 corresponds to both individual patterns having different rotations and mirrored patterns also having different rotations.

The training data 111 is also associated with validation data 112. Here, the validation data 112 and the training data 111 are illustrated separately but may be merged into a single set of data. Either or both supervised machine learning and unsupervised machine learning may be applied to embodiments of the invention. Unsupervised machine learning generally encompasses a process of analyzing data (e.g. using a neural network) to identify groupings, or clusters, of elements having similar features—e.g. it attempts to group similar inputs and identify outliers without "supervision". However, unsupervised machine learning uses does not rely on supervised validation information in order to group elements. In contrast, supervised learning relies on a set of test data (e.g. patterns) and a corresponding known result, e.g., based upon validated data sets provided using manual review by a human. For instance, in the context of FIG. 1, a particular pattern can be input into the tensor processing machine learning module 130 and processed with the supervised machine learning network 131. This processing may comprise inputting patterns into the tensor processing machine learning module 130 at the supervised machine learning network 131 and providing previously determined validation values—e.g. where validation values specify whether a pattern is good or bad. The supervised machine learning network 131 uses the known correct answer to essentially work backwards to determine weights within the neural network that provide the correct answer. Thus, validation data 112 is used in some embodiments to train the tensor processing machine learning module 130, and to provide the trained tensor processing machine learning module 150.

Training data generation rules 114 are used in generating the training data and processing that training data. For instance, training data 111 may comprise multiple sets, groups, or collections of subsets of the training data that share one or more characteristics. For example, training data may be grouped based on technology process, feature size, operating voltage, operating voltage range, a low power process target, a high-performance process target, target packaging type, minimum feature size, minimum/maximum pattern size, anchoring rules used to generate the patterns, or any combination thereof. One particular subset might comprise a 14 nm process for a given fabrication facility for low power applications with associated anchoring rules. Anchoring rules can comprise any repeatable rule used to identify a particular feature in the layout. For example, an anchoring rule might comprise anchoring at all corners, anchoring at either lower or upper corners but not both, a minimum distance e.g. along a particular axis, or any combination or other logical rules. Using these anchoring rules, a plurality of anchoring points are identified from a design under test. Using the locations identified by the anchoring points, a plurality of patterns are generated for analysis corresponding to respective points of the anchoring points. Subsequently, if a particular pattern is reviewed appropriately, the pattern can also be added to the training data 111 along with corresponding information in the validation data 112 and the training data generation rules 113. Regardless of what particular parameters and anchoring rules are selected, any combination or unique combination of training data generation rules 113, can be associated with a particular subset of a pattern library maintained in the training data. Furthermore, each unique combination may be associated with a particular trained tensor processing machine learning module 150 that corresponds to the tensor processing machine learning module 130 trained with that particular combination. In some embodiments, the training data and generation rules 113 are part of a single dataset within training data 111 where individual unique combinations of parameters and anchoring rules are grouped together.

In some embodiments, design rules 114 comprise manually coded design verification rules. Such rules include, for example, DRC (design rule check) rules. These rules comprise codification of know issues for one or more design processes. For instance, design rules may comprise spacing rules for different elements in one or more layers, overlap rules, minimum/maximum thickness rules, or any other rules. Here, the design rules 114 can also be used as inputs to the tensor processing machine learning module. For instance, the rules could be used for generation of one or more patterns that represent acceptable designs (e.g. designs that operate as intended), and unacceptable designs (e.g. designs that do not operate as intended). These patterns are then input into the tensor processing machine learning module 130 with associated validation data (e.g. whether a particular pattern is an error, not an error). In some embodiments, both the trained tensor processing machine learning module and the design rules 114 are processed as part of a single flow to identify issues using, both, the machine learning process and traditional design rules 114.

In some embodiments, an adaptive tensor processor 120 can be used to adapt the stored patterns to a particular set of characteristics. For instance, the adaptive tensor processor would process stored patterns to adapt them to one or more particular sizes that are larger than those stored in the training data 111—e.g. adapt all patterns to ten by ten dimensions in an x and y coordinate space. Processes for adaptation will be discussed further in regard to at least adaptive tensor processing 146.

Tensor processing machine learning module 130 comprises any combination of machine learning processes. For instance, FIG. 1 illustrates the tensor processing machine learning module as including a supervised machine learning network 131 and an unsupervised machine learning network 132. However, other types of machine learning could also be used in the context of the inventive disclosure herein. For example, machine learning also includes semi-supervised learning, active learning, and reinforcement learning. Regardless of the type of machine learning that is utilized, the training process will generate a number of weights and, possibly, configuration parameters. These weights and configuration parameters can be captured in a database for trained captures 155 for later retrieval. For instance, a network accessible database (e.g., trained captures database) can be provided that can be accessed by clients to retrieve information to configure a local instance of a trained tensor processing machine learning module (e.g. 150) for analysis of a design under test. In some embodiments, multiple entities access the trained captures 155, and provide reviewed results for inclusion in the database 110. In some embodiments, individual customers maintain a database equivalent to database 110 which may be initially/repeatedly populated/updated from a vendor's version of database 110.

In some embodiments, the design under test 115 is also stored in the database 110. The design under test may be represented in any form known in the art. For example, the design under test 115 may be represented as a series of layers having a shared coordinate system such that each layer can be overlaid over another. Furthermore, connections between layers (e.g. vias) can be identified including the locations of those vias, and the layers that those vias connect. Regardless of the actual format that the design under test is stored in, the information therein will be processed using the design under test tensor generator 140 and the trained tensor processing machine learning module 150.

Design under test tensor generator 140 includes parameter identification 141, anchoring 142, tensor encoding 144, and adaptive tensor processing 146.

Parameter identification 141 includes identification of relevant parameters for a particular design under test 115 stored in a database (e.g. database 110). For example, assuming a process comprising the previously mentioned 14 nm low power process. For this process, the relevant parameters may include at least the number and relationships of the axis of the design (e.g. 2 or 3 dimensions at 90 degrees to each other) and a minimum feature size. Using these parameters directly or from a database, one can determine the maximum size of a region to be converted into a pattern. For instance, using for simple math, it can be determined that a 10 nm design snapped to 10 nm grids could include 10 different features on each axis in a 100 nm by 100 nm area. Thus, in this example, the maximum x and y dimensions are 10 and 10 respectively and the area from which a pattern is generated will be 100 nm by 100 nm.

Anchoring 142 comprises a process for identifying anchoring points within a design. In order to have the most useable training data 111, the same anchoring rules are normally used for all training and all testing activity for a particular manufacturing process. For example, anchoring at the point of all corners and at the center of all vias could comprise one set of anchoring rules. Another anchoring rule may comprise a minimum distance between anchoring points when there is a layout or via feature—e.g. maximum distance parallel to an axis. Regardless of the particular anchoring rule(s), anchoring points within the design under test 115 are identified using these rules.

Tensor encoding 144 generally comprises a process to convert the layout data from the design under test 115 into a pattern similar to those found in the training data 111. For instance, for each anchoring point, the tensor encoding process 144 will identify the appropriate region around the anchoring point (based on the parameters from 141). Once identified, the region will be converted, e.g., using a lossless process, into a tensor encoding—e.g. a dataset comprising a multidimensional bitmap and two single dimension bitmaps.

The tensors generated by tensor encodings 144 may be provided with differing numbers of values for each dimension (e.g. axis). However, it may be difficult in some situations for patterns having different widths and sizes to be reliably compared using machine learning processes without converting these tensors to a uniform size. In the present embodiment, the adaptive tensor processing 146 processes the generated tensors, in a lossless manner, to generate adapted tensors that are of uniform size.

The output of the design under test tensor generator 140 is input into the trained tensor processing machine learning module 150. As discussed previously the trained tensor processing machine learning module 150 and the tensor processing machine learning module 130 may comprise the same module. In some embodiments, the module is implemented via a gate array (e.g. a field programable gate array). In some embodiments, the module is implemented within a graphics processing unit (GPU) having one or more programmable elements. For instance, a trained supervised machine learning network 151 and a trained unsupervised machine learning network 152 may be implemented using a GPU where the computational cells of the GPU correspond to one or more nodes within the machine learning network (e.g. convolutional neural network). In another embodiment, the module is implemented in software that executes on a central processing unit. Regardless of how the trained tensor processing machine learning module 150 is implemented, the configuration of weights and parameters for the trained module may be retrieved from the trained captures 155.

The output of the trained tensor processing machine learning module 150 can be stored in results database 170. These results can be review at 175 in any number of ways. For instance, an engineer could review only individual results, such as those identified as bad/errors by the machine learning processes. An engineer could review results as a group using a representative sample (e.g. where only one occurrence of each particular pattern is reviewed with the results being applied to all occurrences) to determine if the results are correct. Additionally, both good and bad results could be reviewed, and in turn stored appropriately in the database 110 for use in future training of machine learning modules when appropriate. In some embodiments, the review process of 175 includes both review for the particular design under test, and review for inclusion in the database 110, and thus inclusion in future training processes.

Figure 2:
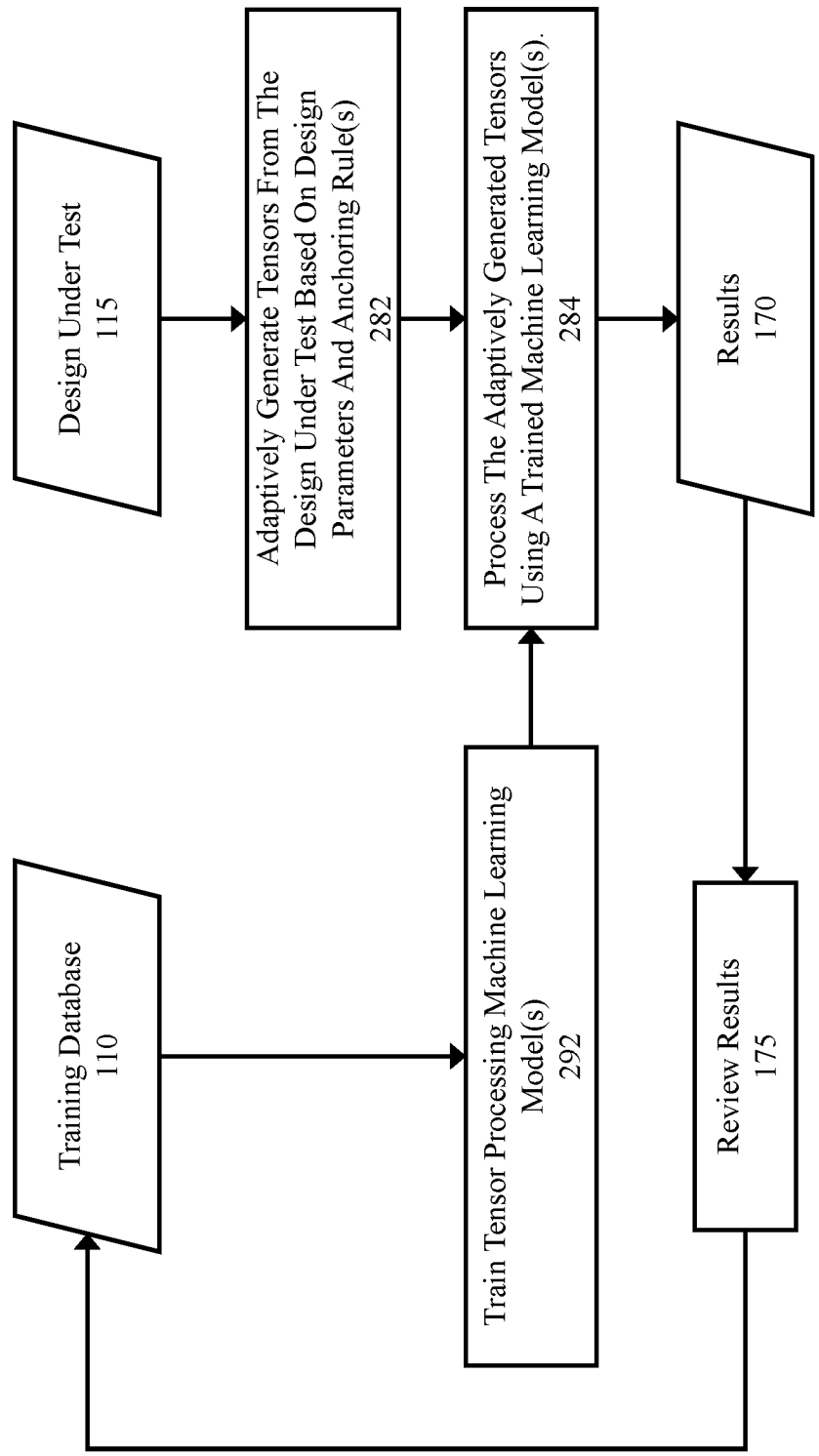
FIG. 2 illustrates a process flow for physical design verification using deep learning according to some embodiments of the invention.

FIG. 2 illustrates a process flow for physical design verification using deep learning according to some embodiments of the invention. The process generally comprises a learning phase (illustrated on the left), a processing phase (illustrated on the right), and a feedback loop. The figure illustrates elements having identifiers previously used where the corresponding previous description applies subject to modification here.

Similar to FIG. 1, the process includes the training database 110 discussed above. However, in this figure, the design under test 115 (also discussed above) is illustrated separately. Additionally, as discussed above, the process includes the generation of results 170 and review of those results 175.

At 282, the process adaptively generates tensors from the design under test 115. In some embodiments this includes the identification of locations/areas for generation of these tensors as determined by the design parameters and anchoring rule(s). Additionally, this includes the lossless generation of the tensors themselves and, where appropriate, lossless adaptation of those tensors. This process will be discussed further in regard to FIGS. 3-6D.

The adaptively generated tensors from 282 are then processed at 284 using trained machine learning model(s). For instance, as discussed above, machine learning models may comprise any number, or types, of models and may further include processing according to one or more design rules (see design rules 114). In some embodiments, machine learning models include one or more of supervised machine learning, semi-supervised machine learning, active machine learning, unsupervised machine learning, or reinforcement machine learning. Regardless of what model(s) are used, the process will generate results 170 which can be analyzed at 175 as discussed above, and which may be included in the training database 110 for use in further training of tensor processing machine learning model(s).

At 292 the tensor processing machine learning model(s) are trained. For instance, as discussed above, the training database 110 could be used to train both supervised and unsupervised machine learning models, or any of the previously identified models. These trained models are subsequently used to process the adaptively generated tensors at 284 as discuss here.

FIG. 3 illustrates an expanded view of the process of adaptively generating tensors from a design under test based on design parameters shown in FIG. 2 according to some embodiments of the invention.

The process starts at 302, where design parameters for the design under test are identified. For example, training data may be grouped based on technology process, feature size, operating voltage, operating voltage range, a low power process target, a high-performance process target, target packaging type, minimum feature size, minimum/maximum pattern size, or any combination thereof. These parameters can then be used to identify a subset of the training data 111 having matching parameters and thus corresponding to the design under test.

Once the design process parameters are identified, anchoring rules for the design under test are identified at 304. In some embodiments, the design under test parameters correspond to one or more subsets of training data 111 that was previously associated with a set of anchoring rules. When there is previously existing training data 111 associated with previously existing anchoring rules, the process will normally use the preexisting anchoring rules as the identified anchoring rules. In some situations, there are no preexisting anchoring rules corresponding to the design under test or a user rejects the preexisting anchoring rules. In the case of rejection or no previously existing set of anchoring rules, a user may specify one or more anchoring rules (either directly or through selection from a library of anchoring rules stored in a database—e.g. database 110). Alternatively, the system may automatically select a set of default anchoring rules.

Once the anchoring rules have been determined, anchoring points are identified within the design under test at 306. Generally, layouts are represented using a shared coordinate system and a set of layers. Each layer may correspond to a different type of material within a design having a different spatial relationship to the other layers of the design. For instance, layers represent material for Pmos, Nmos, filler, spacer, metal, dielectrics, barriers, or vias to name a few. The various layers of a design may be processed to identify anchoring points within the design using the shared coordinate system. For example, a corner is identified by an x and a y coordinate with respect to an origin point of the design. A via may be identified by its center or its most extreme x or y coordinate (e.g. lowest/highest x and lowest/highest y coordinates). Regardless of the particular rules that are used to identify the anchoring points, processing the design to identify these points provides the next process with location information for which patterns are generated.

At 308 the process performs tensor encoding and generation for patterns corresponding to the designs anchoring points. In some embodiments, the anchoring points represents the center of the pattern, the lowest/highest coordinates of the pattern, or a point from which a region can be identified using one or more offsets. Regardless of the region corresponding to the pattern, the pattern itself can be generated by identifying the boundary of features of one or more layers parallel to one or more dimensions, where each such boundary is preserved in a lossless manner. The pattern comprises multiple elements, including for example, a set of elements comprising vectors (or one-dimensional bitmaps) that provide or enable the determination of the distance between two adjacent boundaries perpendicular to a dimension/axis (e.g. x, y, and z axis), and an element that specifies which layers are present in each particular region as defined by the boundaries represented by the vectors. The data may be represented in different ways within the system. In some embodiments, each pattern is given an origin point, and from each origin point the dimensions location/distance from that origin to a boundary can be determined. For example, in a first 2-dimensional embodiment, a lower left corner of a pattern is give an origin point of (0,0) and each boundary is identified by a coordinate relative to that origin point, where boundaries perpendicular to that dimension are represented by an offset from that origin point (e.g. $(x_1,0)$, $(x_2,0)$ or $(0,y_1)$, $(0,y_2)$). Alternatively, each boundary can be identified by a width of each particular region, where a specific coordinate of a specific boundary is equal to the width of all regions before it (e.g. $\Delta x_0$, $\Delta x_1$, or $\Delta y_0$, $\Delta y_0$). However, as a result of this generation technique, the number of boundaries in each pattern is likely to vary.

It is possible that inputting tensors with varying numbers of boundaries into machine learning modules may result in unreliable results. To address this in some embodiments, at 310 the previously generated tensors are losslessly adapted to a uniform size for a particular trained machine learning module. Particular methods of adaptation will be discussed further in regard to FIGS. 4, and 6A-6D.

FIG. 4 illustrates an expanded view of the process to perform adaptive processing of the encoded tensors to generate adapted tensors that correspond to the design process parameters shown in FIG. 3 according to some embodiments of the invention.

The process starts at 402 where an encoded tensor generated for a pattern is identified. For instance, a first tensor from the process discussed in 308 is identified. Subsequently, target dimensions (numbers of boundaries or regions for each axis where the number of boundaries is equal to the number of regions plus one) for the encoded tensor are identified at 404—e.g. topological dimensions for the tensor. In some embodiments, each identified pattern may be associated with multiple target dimensions. For instance, a pattern that has three boundaries in the first dimension and four boundaries in the second dimension is associated with target dimensions of four by four boundaries and ten by ten boundaries because the database can be populated with patterns for both sizes. However, a pattern having six boundaries in a first dimension and 8 boundaries in a second dimension may only have a target dimension of ten by ten, (where ten by ten is the largest pattern for the training data corresponding to the design under test parameters). In some embodiments, all encoded tensors will have the same dimensions, in one or all dimensions (e.g. axis). In some embodiments, tensors may have differing numbers of boundaries along a particular axis. Furthermore, in some embodiments, where a pattern has a different number of boundaries along a particular axis (e.g., resulting in a dominant axis which is an axis with the highest number of boundaries), the pattern is always stored in the pattern library with reference to the dominant axis along a particular dimension (e.g. along the x axis).

Regardless of the order and values of 402 and 404, a current dimension of the encoded target is identified at 406—e.g. the number of values for an axis. This current dimension is then compared to the target dimension at 408, where if the current dimension is less than the target dimension then the process continues at 410 and 412. If the current dimension is not less than the target dimension, then the process continues at 414.

At 410 a determination is made as to the adaptation rules that should be applied, and at 412 those adaptation rules are applied. Again, as with 404 where the adaptation rules are the same for all patterns, the adaptation rules 410 may be more efficiently determined before identification of the tensor at 402. Regardless, at 412 the particular adaptation rules are applied.

In some embodiments, the adaptation rules comprise a recursive process where when the current/modified dimension is less than the target dimension a highest value (or first highest value) is identified, and the tensor is split at that identified value's location, and the process is then repeated while the current/modified dimensions is less than the target dimension.

In some embodiments, a highest value (or first highest value) is identified and split into two or more values such that the dimension is equal to the target dimension (e.g. a dimension having 8 values with the target being 10 values, a highest value of the dimension is selected and divided into 3 equal or approximately equal values). In some embodiments, a minimum value is used to guide divisions, such that a particular value is not divided into values having less the minimum value. For example, a highest value can be selected for division and divided into n parts provided that each part of the n parts is not less than the minimum value. Thus, if the minimum value is 1, a vector comprising (6, 5)

with a target size of ten, then in a first pass the first value of the vector would be divided by 6 (1, 1, 1, 1, 1, 1, 5) so as not to violate the minimum value constraint, and in a second pass, the last value of the vector would be divided by 4 (1, 1, 1, 1, 1, 1, 1.25, 1.25, 1.25, 1.25) which also does not violate the minimum constraint but achieves the desired number of values in the vector.

In some embodiments, multiple values may be identified for splitting to generate a tensor that has widths for each value that are closest to a median value. For instance, a first highest value is identified in the current/modified dimension, a determination is made as to the second highest value, a determination is made as to how many whole parts (e.g. 2, 3, 4, . . . -integer number of parts) the first highest value must be divided by such that the resulting value is equal to or less than the second highest value, the first highest dimension is then split into "n" values-provided "n−1" is not greater than the difference between the current width and the target width and "n" is not less than 2. As a result, "n−1" new values are added to the current/modified dimension. Subsequently the process is repeated while the current width is less than the target width. In the event that a value generated by an earlier division is identified for additional divisions, the process must reapportion at least some of the values of each division associated with the same original value, such that all divisions of the same original value are equal. This may be completed in multiple ways. For instance, one way comprises first merging the values generated corresponding to the same original value back together to recreate the original value. Subsequently, splitting that original value into at least 1 more part than previously split into—e.g. the original value is divided by the original n plus at least one. To illustrate, a tensor dimension having the values (7, 14, 21, 7, 54) and a target dimension of ten may be divided into a tensor having dimensions of (7, 14, 21, 7, 18, 18, 18) in a first pass and (7, 14, 10.5, 10.5, 7, 18, 18, 18) in a second pass. However, in a third pass, the process would determine that 18 is the largest number but is also associated with a previously split value (54). Thus, the process must reapportion the values corresponding to the original value of 54. For instance, first the three values having widths 18 are merged to generate (7, 14, 10.5, 10.5, 7, 54) and second the merged/original value is divided into at least 1 or more parts, e.g. (7, 14, 10.5, 10.5, 7, 13.5, 13.5, 13.5, 13.5). Finally, in a fourth pass, the value 14 is split into two entries of 7-(7, 7, 7, 10.5, 10.5, 7, 13.5, 13.5, 13.5, 13.5). Thus, the final modified tensor will have the dimensions (7, 7, 7, 10.5, 10.5, 7, 13.5, 13.5, 13.5, 13.5).

Furthermore, in addition to the processes discussed here, the splitting of each dimension is combined with the division/splitting of the bitmap as discussed in FIGS. 6A-6D by duplication of corresponding rows or columns.

At 414, a determination is made as to whether all dimensions for the encoded tensor have been processed. If all dimensions have not been processed the flow returns to 406 to identify a different dimension. If all dimensions have been processed the flow proceeds to 416 where it is determined whether there are any additional encoded tensors for processing. If there are no additional encoded tensors for processing then the process ends at 418, otherwise the process returns to 402 for identification of another encoded tensor for processing.

FIGS. 5A-5D and 6A-6D illustrate the above techniques on an example layout portion. FIGS. 5A-5D provide an illustration for generating a layout pattern in a format that allows for lossless representation of a layout pattern, in a format that allows for the modification of the representation of that pattern (e.g., scaling, rotating, and/or mirroring), without causing any loss of fidelity. FIGS. 6A-6D illustrate using that representative format to change the scale of the illustrated layout pattern.

FIGS. 5A-5D illustrates an example process of tensor encoding and generation for an example pattern according to some embodiments of the invention.

Figure 5A:
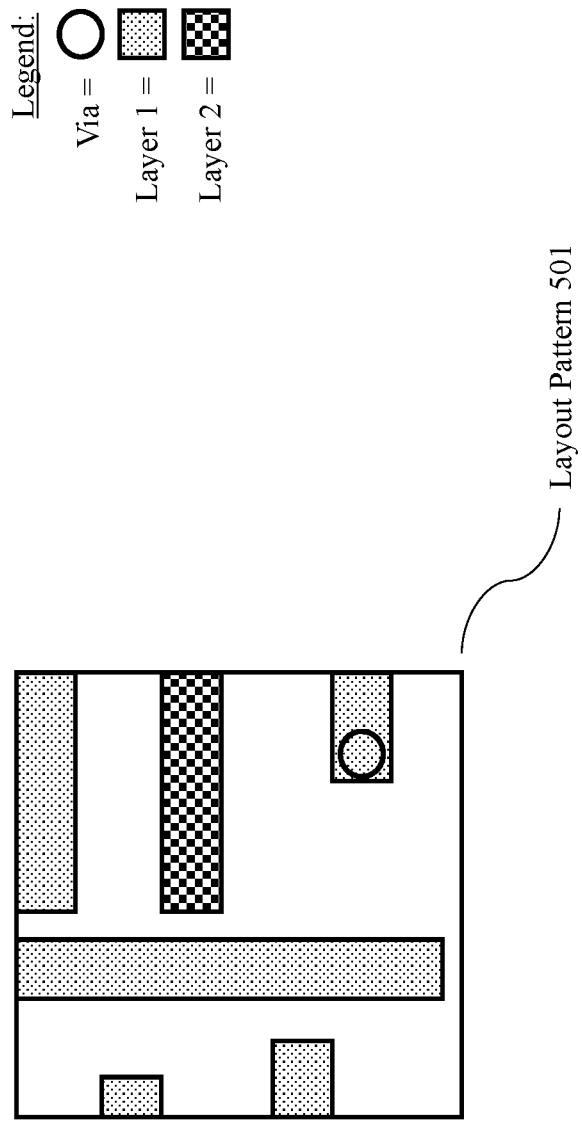
FIG. 5A-5D illustrates an example process of tensor encoding and generation for an example pattern according to some embodiments of the invention.

FIG. 5A illustrates a layout pattern 501 for encoding. The layout pattern includes a region captured from the design under test having a width and height as determined according to the previously discussed parameters. Additionally, the pattern could have been identified based at least in part on a location determined by one or more corresponding anchoring rule(s).

For the sake of illustration, the pattern provided is relatively simple having only two planar layers (layer 1 and layer 2) and only one via layer (connecting to a layer ignored here for ease of illustration—e.g. a ground plane).

Figure 5B:
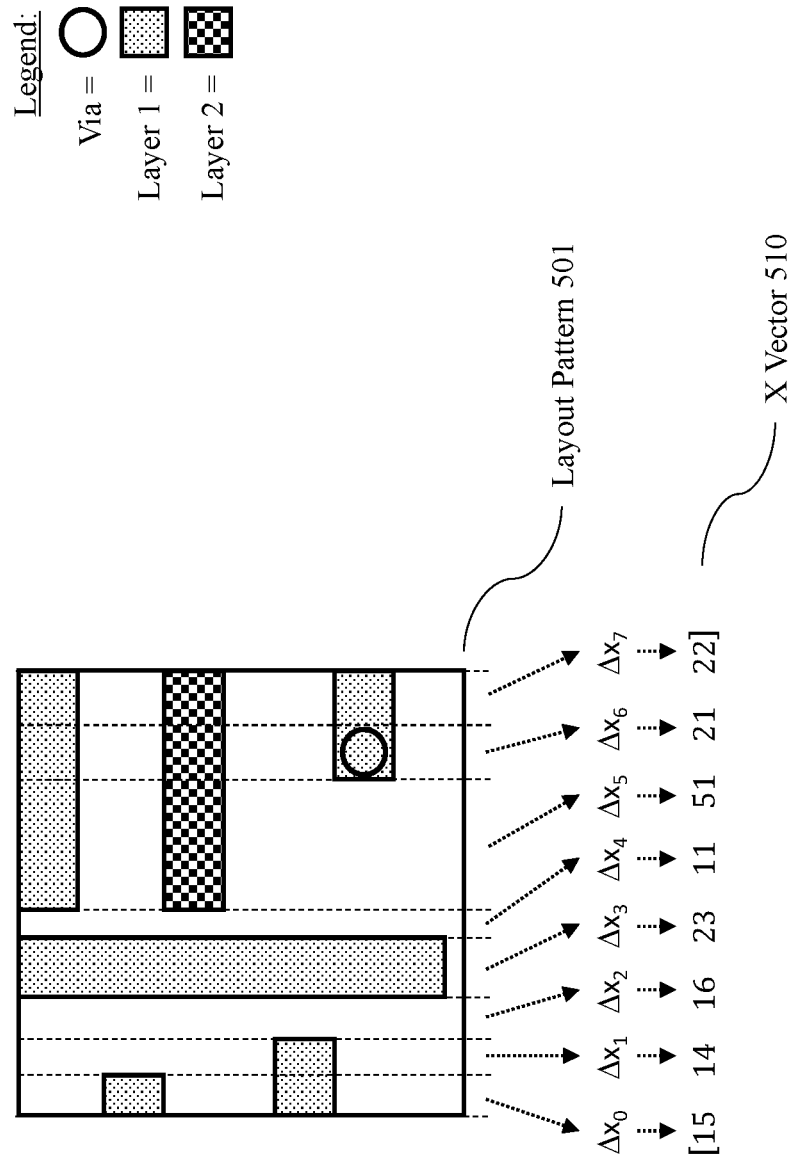

FIG. 5B illustrates the identification of the boundaries along the horizontal (e.g. x dimension). In particular, FIG. 5B illustrates the boundaries and the representation thereof as widths by the X vector 510. For instance, the left and right edges of the pattern represent the first and last boundaries respectively. The distance between the first boundary and the second boundary is represented in the X vector 510 as $\Delta x_0$ which equals 15. The distance between the third boundary and the second boundary is represented in the X vector 510 as $\Delta x_1$ which equals 14, and so on—such that the value the of X vector 510 comprises a series of values that represent the widths between each adjacent boundary, which as illustrated here comprises [15, 14, 16, 23, 11, 51, 21, 22] and corresponds to $\Delta x_0$, $\Delta x_1$, $\Delta x_2$, $\Delta x_3$, $\Delta x_4$, $\Delta x_5$, $\Delta x_6$, $\Delta x_7$. Furthermore, FIG. 5B illustrates the lossless aspect with regard to a first dimension. Specifically, each boundary for the illustration can be constructed or reconstructed from the X vector 510. Thus, the location or relative coordinates of the boundaries perpendicular to the x axis can be identified by summing the $\Delta x$ values preceding the boundary.

Figure 5C:
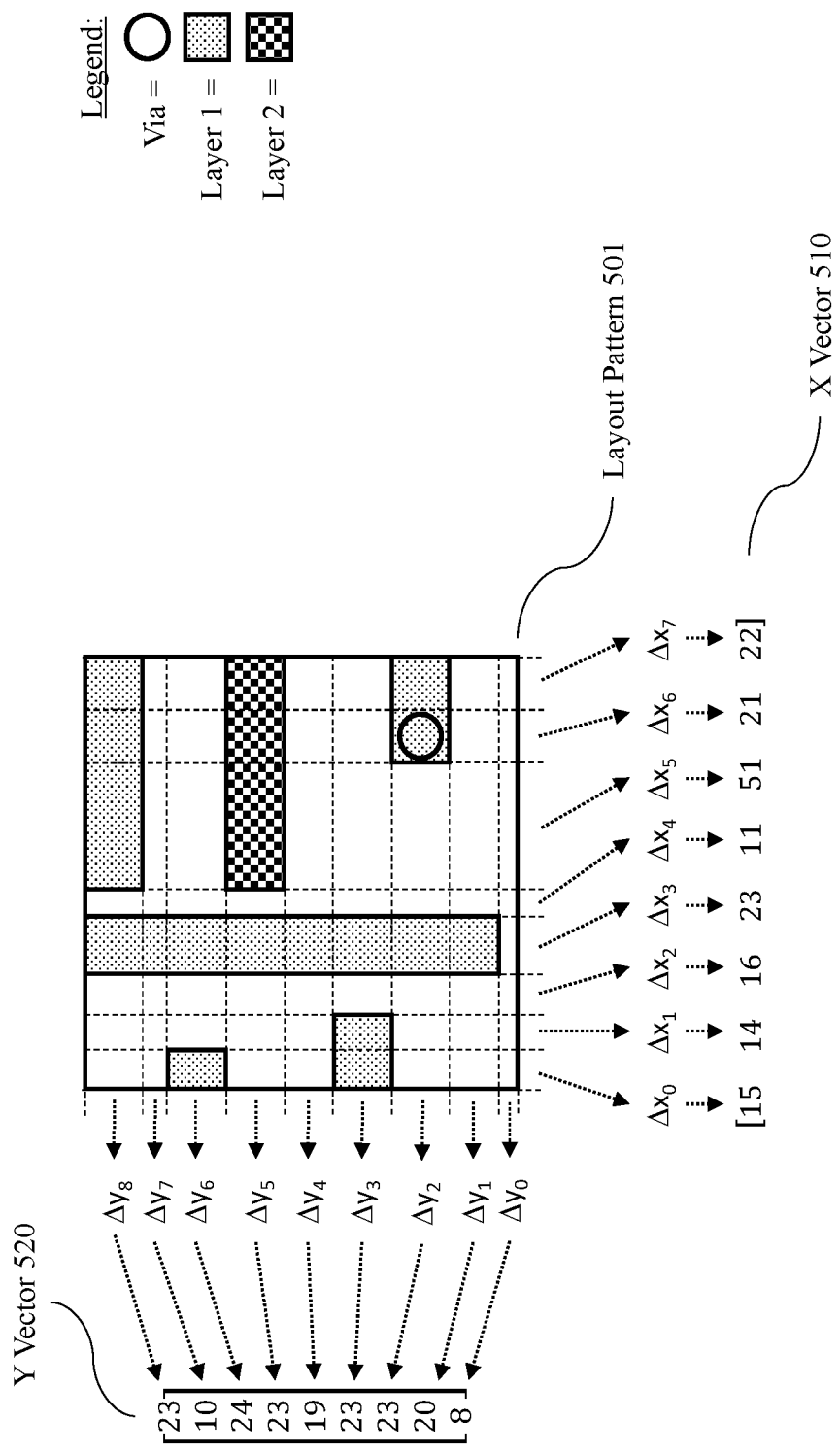

FIG. 5C illustrates the identification of the boundaries along the vertical dimension (e.g. y dimension). In particular, FIG. 5C illustrates the boundaries and the representation thereof as widths by the Y vector 520. For instance, the lowest and highest edges of the pattern represent the first and last boundaries respectively. The distance between the first boundary and the second boundary is represented in the Y vector 520 as $\Delta y_0$ which equals 8. The distance between the third boundary and the second boundary is represented in the Y vector 520 as $\Delta y_1$ which equals 20, and so on—such that the value of the Y vector 520 comprises a series of values that represent the widths between each adjacent boundary, which as illustrated here comprises [8, 20, 23, 23, 19, 23, 24, 10, 23] and corresponds to $\Delta y_0$, $\Delta y_1$, $\Delta y_2$, $\Delta y_3$, $\Delta y_4$, $\Delta y_5$, $\Delta y_6$, $\Delta y_7$, $\Delta y_8$. Furthermore, FIG. 5C illustrates the lossless aspect with regard to a second dimension. Specifically, each boundary for the illustration can be constructed or reconstructed from the Y vector 520. Thus, the location or relative coordinates of the boundaries perpendicular to the y axis can be identified by summing the $\Delta y$ values preceding the boundary.

Figure 5D:
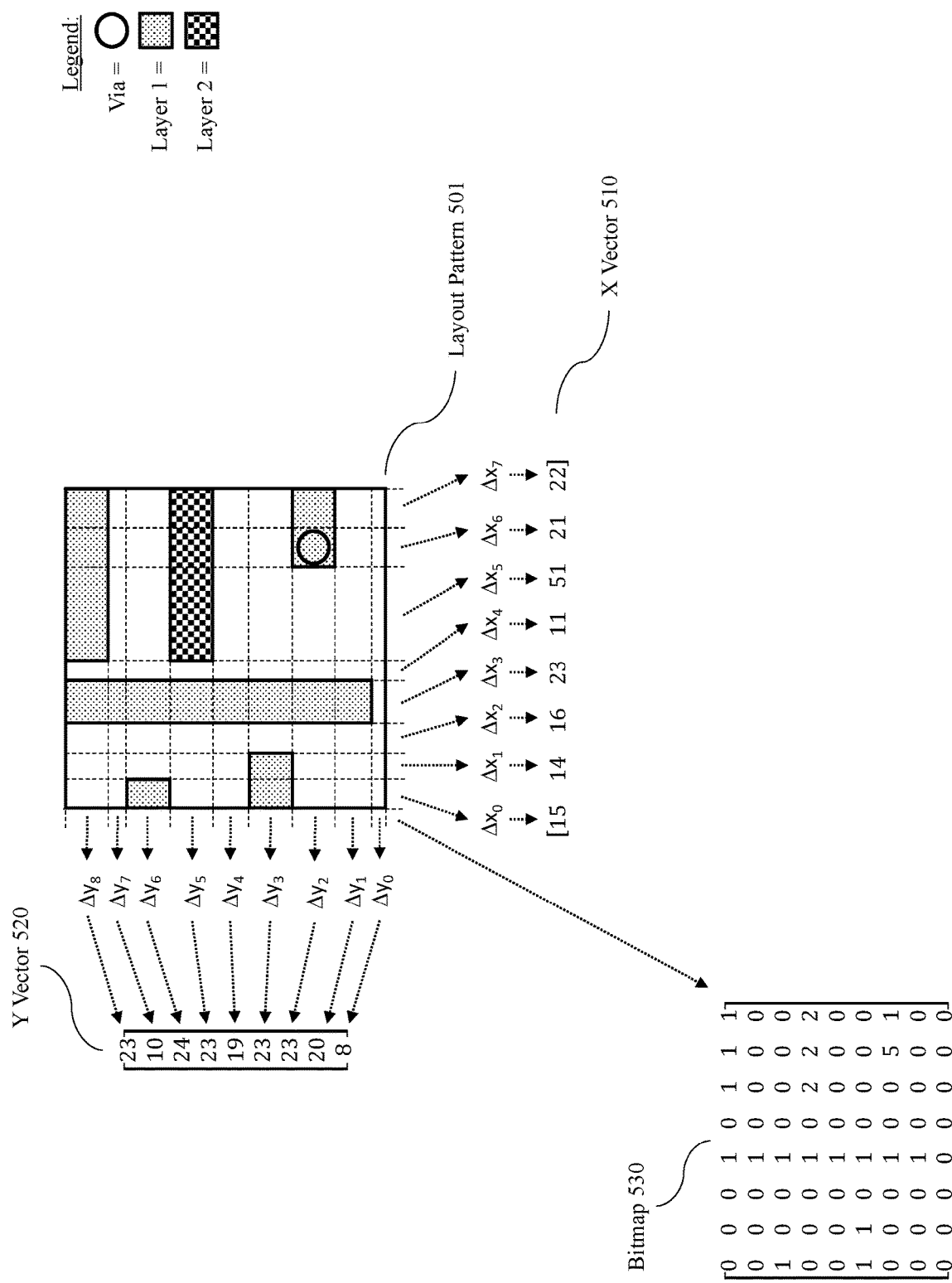

FIG. 5D illustrates the identification of the values for the bitmap. In some embodiments, each tensor comprises three elements (e.g. elements corresponding to the X vector 510, the Y vector 520, and the bitmap 530). As illustrated, pairs of X boundaries and pairs of Y boundaries intersect to form regions defined by the area within these pairs. If the region within these pairs does not include a layer or via a corresponding value is defined as zero. If the region within these pairs includes a layer or via the bitmap of that region is set to a value that represents the layer(s) present. In some embodiments, each layer is represented by a unique number (e.g. a bit value in a binary number). For instance, if one assume that layer 1 is represented by 1, layer 2 is represented by 2 and layer 3 is represented by 4, then the region corresponding to Δy6 and Δx0, includes only layer 1 and is therefore represented by 1, the region corresponding to Δy5 and Δx5, includes only layer 2 and is therefore represented by 2, but the region corresponding to Δy2 and Δx6, includes layer 1 and the via layer, thus the region is represented by 5 (1+4). Thus, if this is applied to the layout pattern 501 the resulting bitmap 530 appears as shown in the figure.

Furthermore, FIG. 5D serve to illustrate the lossless encoding of the portion of the circuit layout as embodied by a tensor. In particular, the tensor encodes the boundaries of the layers within an encoded portion of a circuit layout and the values in the areas defined by those boundaries. Using the X vector 510 and the Y vector 520 regions and widths thereof can be defined without deviation from the boundaries in the original pattern they encode. Each region can then be recreated using the bitmap 530. This is because each region defined by the X vector 510 and Y vector 520 corresponds to a value in the bitmap 530, and each value in the bitmap 530 corresponds to the specific layers present in each region. Thus, the tensor contains all the information necessary to recreate the original pattern from which it was generated.

FIGS. 6A-6D illustrates an example process of adaptive tensor encoding and generation for an example pattern according to some embodiments of the invention.

In particularly, the figures illustrate layout pattern 501 associated with X vector 510, Y vector 520, and bitmap 530 being adapted according to one embodiment and as discussed in regard to FIGS. 5A-6D. For this example, if the target x and y dimensions are ten by ten regions and utilize a recursive process to adapt the tensor.

FIG. 6A illustrates a first adaptation of the x dimension for the layout pattern 501. Here the X vector 510 includes eight values. However, as previously indicated the tensor should have ten by ten regions. In order to implement the adaptation of the current vector, the figure illustrates the identification of the first largest value in the X vector 510, and the splitting of this value into two equal values in X vector 511. Specifically, the area associated with the value 51 (Δx$_5$) of the X vector 510 [15, 14, 16, 23, 11, 51, 21, 22] is split, generating X vector 511 [15, 14, 16, 23, 11, 25.5, 25.5, 21, 22]. Additionally, this split of the X vector 510 is associated with a new reference line 650 that is not associated with a normal boundary but is instead associated with an artificial boundary—e.g. the one created by splitting the area associated with 51. Furthermore, the bitmap 530 is modified to account for the splitting of the X vector value. Here, this is accomplished by identifying the column associated with Δx$_5$ the 6$^{th}$ column and inserting a copy of that column either before or after the 6$^{th}$ column (see bitmap 531).

FIG. 6B illustrates a second adaptation of the x dimension for the layout pattern. Here, the X vector 531 includes only nine values which is still short of the target number of values of ten. Pursuant to this, the figure illustrates the splitting of the first highest value (Δx$_5$) in the X vector 511 into two values in the X vector 512. Specifically, the value 25.5 (Δx$_5$) of the X vector 511 [15, 14, 16, 23, 11, 25.5, 25.5, 21, 22] is split, generating X vector 512 [15, 14, 16, 23, 11, 12.25, 12.25, 25.5, 21, 22]. Additionally, this split of the X vector 511 is associated with a new reference line 651 that is, again, not associated with a normal boundary but is instead associated with an artificial boundary. Furthermore, the bitmap 531 is modified to account for the splitting of the X vector value. Here, this is accomplished by identifying the column associated with Δx$_5$ the 6$^{th}$ column and inserting a copy of that column either before or after the 6$^{th}$ column (see bitmap 532). As a result, the X vector 512 and the bitmap 532 have been adapted to the appropriate width in the x dimension—e.g. ten values in the x dimension.

Figure 6C:
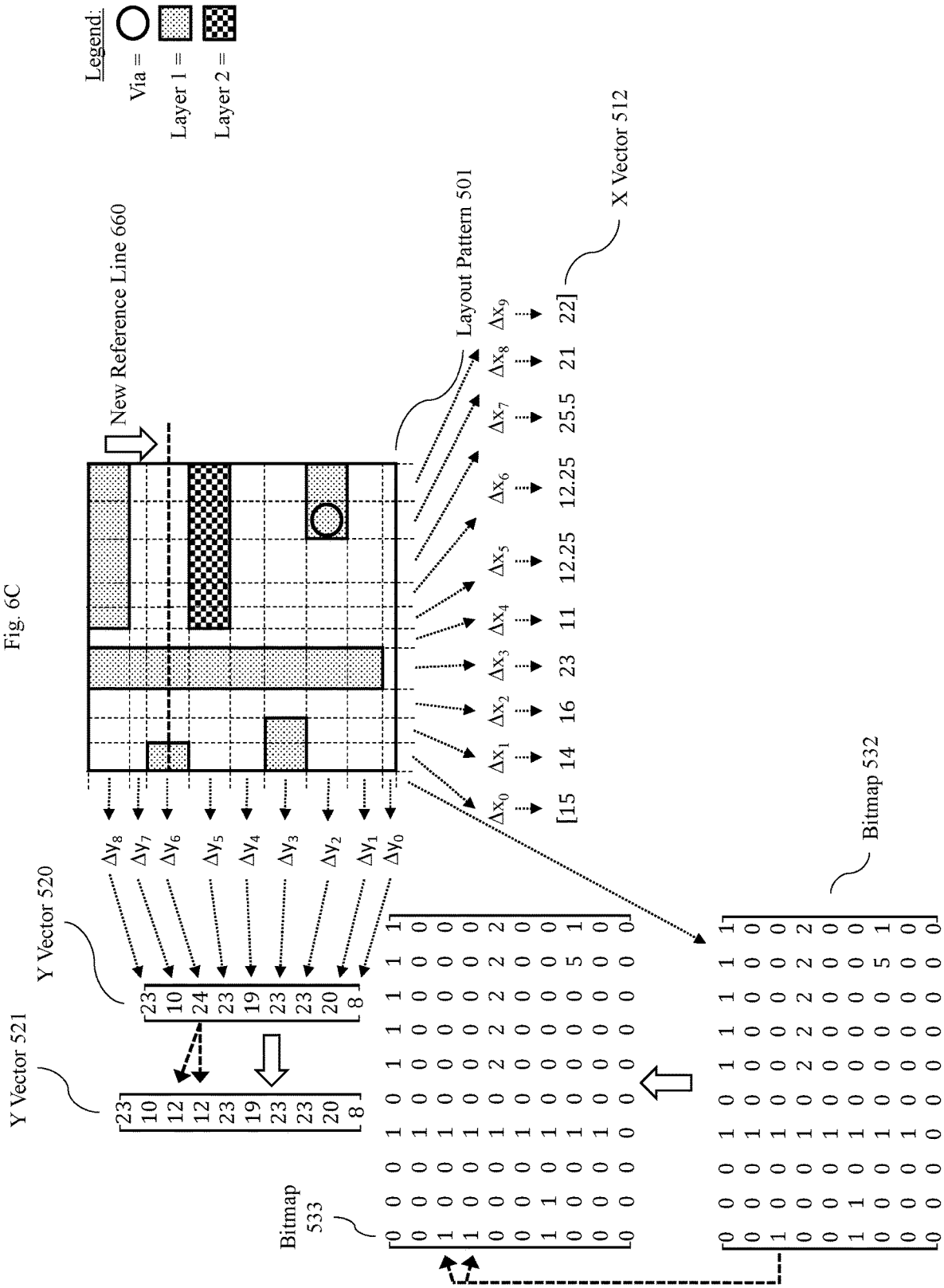

FIG. 6C illustrates an adaptation of the y dimension for the layout pattern. Here, the Y vector 521 includes only nine values which is short of the target number of values of ten. Pursuant to this, the figure illustrates the splitting of the first highest value in the Y vector 520 (Δy$_6$) into two values in the Y vector 521. Specifically, the Δy$_6$ of the Y vector 520 [8, 20, 23, 23, 19, 23, 24, 10, 23] is split, generating the Y vector 521 [8, 20, 23, 23, 19, 23, 12, 12, 10, 23]. Additionally, this split of the Y vector 520 is associated with a new reference line 660 that is not associated with a normal boundary but is instead associated with an artificial boundary. Furthermore, the bitmap 532 is modified to account for the splitting of the Y vector value of Δy$_6$. Here, this is accomplished by identifying the column associated with Δy$_6$, the 7$^{th}$ row, and inserting a copy of that row either before or after the 7$^{th}$ column (see bitmap 533). As a result, the Y Vector 520 and the bitmap 532 have been adapted to the appropriate width in the y dimension. This is represented in FIG. 6D by the final adapted tensor comprising X vector 512, Y vector 521, and bitmap 533.

In some embodiments, the adaptation process is also lossless just as the tensor generation process is. For instance, the process can be reverted by combining rows and columns (and corresponding Δx and Δy values) where two adjacent rows or columns having identical values can be combined. For instance, in the bitmap 533 rows seven and eight of ten have identical values. Thus, one of these columns can be removed, and the corresponding Δy values can be merged (Δy$_6$ and Δy$_7$). Likewise, for the bitmap 533, columns six, seven, and eight have identical values. Thus, two of columns six, seven, and eight can be removed and the corresponding Δx values can be merged (Δx$_5$, Δx$_6$, and Δx$_7$) into a single value. If such operations where completed, the tensor before adaptation would be recreated. Additionally, as discussed above, the previously generated tensor also losslessly represents the portion of the circuit layout.

The processes of FIGS. 5A-6D can be performed on portions of circuit layouts for use in generating a training dataset to be stored in the database (e.g. database 110) and for generating tensors for processing with a trained machine learning module, such as the recited supervise and unsupervised machine learning models. Processing circuit layout portions as described generates a plurality of patterns for analysis without utilizing techniques that rely on padding, and thus does not obscure the encoded tensor. The present approach losslessly represents the portion of the circuit layout and minimizes the size of the pattern. As a result, the encoding minimizes the amount of volatile and/or non-volatile storage (e.g., memory) required for storing and processing the patterns. Additionally, because the pattern is not encoded with padding, one or more hardware processors (e.g., a CPU) can also operate more efficiently. For instance, because the processor does not have to retrieve, store, or process additional data representing padding, the processor will utilize less memory, I/O bandwidth, and fewer computing cycles.

In some embodiments, the identification of the initial pattern region is as described above in regard to parameter identification 141 and anchoring 142, based on the training data generation rules 113 and the design under test 115. (see FIG. 1 and FIG. 5A.) Furthermore, in some embodiments, the tensor is initially encoded at tensor encoding 144. (See FIG. 1 and FIGS. 5B-5D). In some embodiments, the adapted encoded tensor, such as one encoded using tensor encoding 144, is adaptively generated from the tensor encoding output from 144 at adaptive tensor processing 146. (See FIG. 1 and FIGS. 6A-6D). Circling back to the example apparatus of FIG. 1, these processes may take place within the design under test tensor generator 140 which outputs results to a trained tensor processing machine learning module 150. The trained tensor processing machine learning module 150 may include supervised and unsupervised machine learning networks 151 and 152 respectively that can either solely or both be used to generate a set of results (e.g. results 170). It is these results 170, that may be review by an engineer in order to identify issues with a design, and in order to supplement the database 110 (see training data 111 and validation data 112) to use for future training of machine learning modules (e.g. 130). Thus, the disclosed process and apparatus can be incrementally improved with further use.

Implementing at least some of the processes disclosed here provides a new way to implement quality control processes that do not require manually programmed rules or even rules at all. Thus, this improves both the field and the function of the technology/computer by proving a process that improves the field of design verification and analysis and by providing new functionality. For instance, using the herein disclosed machine learning process, issues not matching a preprogrammed rule, or not previously identified could be identified—whereas traditional design rule checking only identifies previously known and codified issues. Furthermore, this disclosure provides an iterative process for identifying and improving identification of issues without requiring manual encoding of such issues. Furthermore, the machine learning processes disclosed herein also improves design for manufacturing processes by addressing issues that arise because of the manufacturing process through use of pattern processing. Additionally, the processes disclosed herein improves machine learning processes and their application to circuit layouts because the disclosure provides for processing patterns without adding padding that might significantly reduce the signal to noise ratio of the pattern.

Therefore, what has been described is an improved system, media, and method for deep learning applications in physical design verification. Generally, the approach includes maintaining a pattern library for use in training machine learning model(s). The pattern library being generated adaptively and supplemented with new patterns after review of those patterns. In some embodiments, multiple types of information may be included in the pattern library, including validation data, and parameter and anchoring data used to generate the patterns. In some embodiments, the machine learning processes are combined with traditional design rule analysis.

System Architecture Overview

Figure 7:
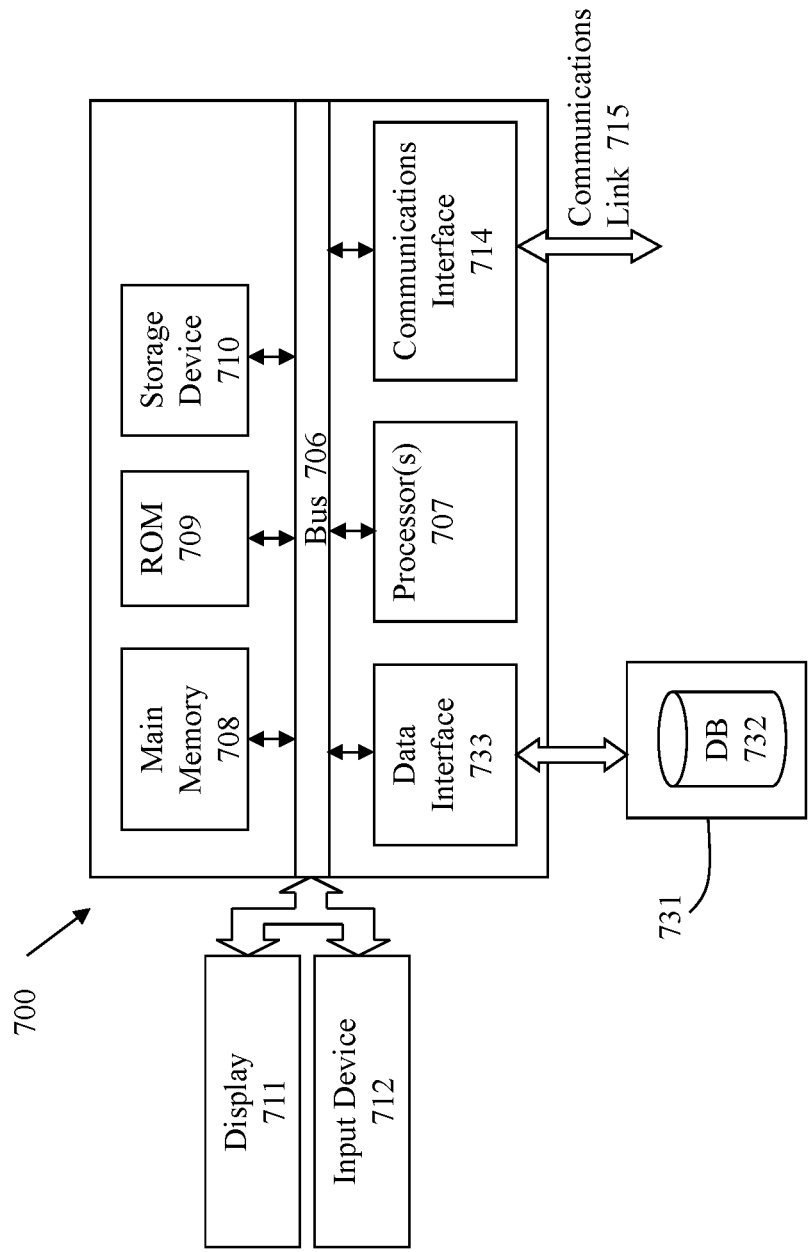
FIG. 7 is a block diagram of an illustrative computing system suitable for implementing an embodiment of the present invention.

FIG. 7 is a block diagram of an illustrative computing system suitable for implementing an embodiment of the present invention. The illustrated main memory 608 may correspond to the recite memory controller 101 and to the memory 108. Computer system 700 includes a bus 706 or other communication mechanism for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control.

According to one embodiment of the invention, computer system 700 performs specific operations by processor 707 executing one or more sequences of one or more instructions contained in system memory 708. Such instructions may be read into system memory 708 from another computer readable/usable medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program, e.g., application code, through communication link 715 and communication interface 714. Received program code may be executed by processor 707 as it is received, and/or stored in disk drive 710, or other non-volatile storage for later execution. Computer system 700 may communicate through a data interface 733 to a database 732 on an external storage device 731.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method for losslessly encoding portions of circuit layouts for machine learning using a tensor processing machine learning module, comprising:
generating a plurality of tensors from a circuit layout, the plurality of tensors having one or more sizes and losslessly encoding a plurality of portions of the circuit layout, a tensor comprising at least a bitmap having a plurality of rows and column, and a width for each row and each column;

determining that at least some of the plurality of tensors generated from the circuit layout have dimensions less than one or more target dimensions, the target dimensions comprising one or more corresponding dimensions of tensors stored in a training database, wherein the tensors stored in the training database were used to train a machine learning model;

modifying, in response to said determination, at least some of the plurality of tensors generated from the circuit layout having dimensions less than one or more target dimensions at least by scaling the at least some of the plurality of tensors, wherein scaling comprises at least splitting an existing row or column in a corresponding tensor into two rows or columns and where a width of the existing row or column is equal to a sum of a width of the two rows or columns; and processing the plurality of tensors using the trained machine learning model.

2. The method of claim 1, further comprising identifying a design having the circuit layout and a process parameter for the circuit layout.

3. The method of claim 1, further comprising identifying an anchoring rule for the circuit layout and a plurality of anchoring locations for the circuit layout.

4. The method of claim 1, wherein the width of the two rows or columns are equal, the two rows or columns are adjacent to each other, and the width of rows and columns of an individual tensor is maintained as vectors.

5. The method of claim 1, wherein the trained machine learning model is generated using one or more tensors from a training database.

6. The method of claim 1, further comprising reviewing one or more results from processing the plurality of tensors using a trained machine learning model, wherein at least some of the results are stored in a training database for future use in training machine learning models.

7. The method of claim 1, wherein the trained machine learning model corresponds to a supervised machine learning network or an unsupervised machine learning network.

8. The method of claim 1, wherein the trained machine learning model is instantiated by at least retrieving a trained machine learning model capture.

9. The method of claim 1, wherein modifying at least some of the plurality of tensors is lossless and scaling is performed without adding padding to the at least some of the plurality of tensors.

10. A non-transitory computer readable medium having stored thereon a sequence of instructions which, when executed by a processor performs a set of acts for losslessly encoding portions of circuit layouts for machine learning using a tensor processing machine learning module, the set of acts comprising:

generating a plurality of tensors from a circuit layout, the plurality of tensors having one or more sizes and losslessly encoding a plurality of portions of the circuit layout, a tensor comprising at least a bitmap having a plurality of rows and column, and a width for each row and each column;

determining that at least some of the plurality of tensors generated from the circuit layout have dimensions less than one or more target dimensions, the target dimensions comprising one or more corresponding dimensions of tensors stored in a training database, wherein the tensors stored in the training database were used to train a machine learning model;

modifying, in response to said determination, at least some of the plurality of tensors generated from the circuit layout having dimensions less than one or more target dimensions at least by scaling the at least some of the plurality of tensors, wherein scaling comprises at least splitting an existing row or column in a corresponding tensor into two rows or columns and where a width of the existing row or column is equal to a sum of a width of the two rows or columns; and processing the plurality of tensors using the trained machine learning model.

11. The computer readable medium of claim 10, wherein the set of acts further comprise identifying a design having the circuit layout and a process parameter for the circuit layout.

12. The computer readable medium of claim 10, wherein the set of acts further comprise identifying an anchoring rule for the circuit layout and a plurality of anchoring locations for the circuit layout.

13. The computer readable medium of claim 10, wherein the width of the two rows or columns are equal, the two rows or columns are adjacent to each other, and the width of rows and columns of an individual tensor is maintained as vectors.

14. The computer readable medium of claim 10, wherein the trained machine learning model is generated using one or more tensors from a training database.

15. The computer readable medium of claim 10, wherein the set of acts further comprise reviewing one or more results from processing the plurality of tensors using a trained machine learning model, wherein at least some of the results are stored in a training database for future use in training machine learning models.

16. The computer readable medium of claim 10, wherein the trained machine learning model corresponds to a supervised machine learning network or an unsupervised machine learning network.

17. The computer readable medium of claim 10, wherein the trained machine learning model is instantiated by at least retrieving a trained machine learning model capture.

18. The computer readable medium of claim 10, wherein modifying at least some of the plurality of tensors is lossless and scaling is performed without adding padding to the at least some of the plurality of tensors.

19. A system comprising:

a storage medium having stored thereon a sequence of instructions; and a processor that executes the sequence of instructions to perform a set of acts for losslessly encoding portions of circuit layouts for machine learning using a tensor processing machine learning module, the set of acts comprising:

generating a plurality of tensors from a circuit layout, the plurality of tensors having one or more sizes and losslessly encoding a plurality of portions of the circuit layout, a tensor comprising at least a bitmap having a plurality of rows and column, and a width for each row and each column;

determining that at least some of the plurality of tensors generated from the circuit layout have dimensions less than one or more target dimensions, the target dimensions comprising one or more corresponding dimensions of tensors stored in a training database, wherein the tensors stored in the training database were used to train a machine learning model;

modifying, in response to said determination, at least some of the plurality of tensors generated from the circuit layout having dimensions less than one or more target dimensions at least by scaling the at least some of the plurality of tensors, wherein scaling comprises at least splitting an existing row or column in a corresponding tensor into two rows or columns and where a width of the existing row or column is equal to a sum of a width of the two rows or columns; and processing the plurality of tensors using the trained machine learning model.

20. The system of claim 19, wherein the set of acts further comprise identifying a design having the circuit layout and a process parameter for the circuit layout.

\* \* \* \* \*